(12) United States Patent
Chen et al.

(10) Patent No.: US 7,944,709 B2
(45) Date of Patent: May 17, 2011

(54) MICRO-SENSOR AND MANUFACTURING METHOD THEREOF

(75) Inventors: Parn-Far Chen, Hsinchu (TW); Hsiu-Wu Tung, Dajia Township, Taichung County (TW); Chao-Yu Chou, Taipei (TW)

(73) Assignee: Altek Corporation, Hsinchu (TW)

( * ) Notice: Subject to any disclaimer, the term of this patent is extended or adjusted under 35 U.S.C. 154(b) by 465 days.

(21) Appl. No.: 12/078,774

(22) Filed: Apr. 4, 2008

(65) Prior Publication Data

US 2009/0154130 A1    Jun. 18, 2009

(30) Foreign Application Priority Data

Dec. 12, 2007   (TW) ................................ 96147507 A

(51) Int. Cl.
*H01R 12/16* (2006.01)
(52) U.S. Cl. ........................ 361/785; 361/803
(58) Field of Classification Search .................. 361/803, 361/760, 785; 348/262; 29/825; 439/75, 439/83
See application file for complete search history.

(56) References Cited

U.S. PATENT DOCUMENTS

| | | | | |
|---|---|---|---|---|
| 4,647,133 | A * | 3/1987 | Renken et al. | 439/426 |
| 6,287,130 | B1 * | 9/2001 | Torii | 439/83 |
| 2006/0132630 | A1 * | 6/2006 | Kim et al. | 348/294 |
| 2008/0198249 | A1 * | 8/2008 | Tanimura et al. | 348/294 |
| 2009/0167909 | A1 * | 7/2009 | Imagawa et al. | 348/262 |

* cited by examiner

*Primary Examiner* — Yuriy Semenenko
(74) *Attorney, Agent, or Firm* — Rabin & Berdo, P.C.

(57) ABSTRACT

The micro-sensor includes a first circuit substrate and a second circuit substrate. One surface of the first circuit substrate has an image sensing device electrically connected to main printed wires formed by a first wire group and a second wire group. On the other surface of the first circuit substrate has a main connector electrically connected to the second wire group. A plurality of first signal transmission lines connected to the first wire group. The second circuit substrate has a sub-connector that is electrically connected to sub printed wires having an equivalent number as and corresponding to the second wire group. The other end of the sub printed wires is electrically connected to a plurality of second signal transmission lines. Through connecting the connectors respectively disposed in different circuit boards to overcome the difficulty in the manufacturing process of concentrating all devices on a single circuit board.

10 Claims, 4 Drawing Sheets

MICRO-SENSOR AND MANUFACTURING METHOD THEREOF

CROSS-REFERENCE TO RELATED APPLICATIONS

This non-provisional application claims priority under 35 U.S.C. §119(a) on Patent Application No(s). 096147507 filed in Taiwan, R.O.C. on Dec. 12, 2007, the entire contents of which are hereby incorporated by reference.

BACKGROUND OF THE INVENTION

1. Field of the Invention

The present invention relates to a micro-sensor, and more particularly to a micro-sensor having two connectors.

2. Related Art

When patients take an endoscopic examination, two kinds of instruments are generally used. One kinds of instrument is a traditional endoscope, in which one end of a long black tube is connected to a machine having a cold-light source that is capable of generating cold lights, and the tube contains the optic fibers therein. The optic fibers are capable of transferring the cold lights to the other end of the tube. During examination, the tube is inserted into an organ to be examined, cold lights from the cold-light source illuminates the interior of the organ, and then a photo sensor chip disposed on the end of the tube transfers clear image signals back to the machine. A computer in the machine then converts the signals into images. The other one kinds of instrument is a capsule endoscope, which is a micro image pick-up device, and it is as small as a capsule. The capsule endoscope includes a photo sensor chip, a light emitting diode (LED), a battery, and a wireless transmitter, and so on. Many organs in a human body cannot be easily examined through an endoscope. The endoscope is also difficult to be manipulated as the traditional endoscope is excessively long. For example, small intestine is a narrow winding path zigzagged in the abdominal cavity. A rigid tube is inserted in the winding intestine and wound there along may unavoidably hurts the soft and tender intestine more or less. Therefore, physicians may use capsule endoscope to replace traditional endoscopes.

Regardless of the traditional endoscope or the capsule endoscope, a micro-sensor is used to sense image signals. Referring to FIG. 1, it is a schematic view of a conventional micro-sensor. The conventional micro-sensor 10 includes a circuit substrate 1, a plurality of wiring groove structures 2, and an image sensing device 3. The circuit substrate 1 has metal wires 4 formed thereon, and the plurality of wiring groove structures 2 is formed on a side of the micro-sensor 10. The image sensing device 3 is disposed oh the circuit substrate 1 and electrically connected to one end of the metal wires 4. The other end of the metal wires 4 is exposed out of the plurality of wiring groove structures 2 for being connected to a plurality of transmission lines corresponding to the plurality of wiring groove structures 2, so as to transfer the image signals. The conventional micro-sensor 10 is restricted in volume, and thus the volume of the adopted circuit substrate 1 is correspondingly limited. Furthermore, the processes of manufacturing a plurality of wiring groove structures 2 on the circuit substrate and connecting the plurality of transmission lines to the end of the metal wires 4 exposed out of the plurality of wiring groove structures 2 may further increase the difficulty in manufacturing the micro-sensor 10. Therefore, additional auxiliary equipments are generally required for such manufacturing process, and as a result, the manufacturing process is both labor-consuming and time-consuming. The manufacturing cost cannot be reduced.

SUMMARY OF THE INVENTION

In order to overcome the difficulties in manufacturing a circuit substrate and wiring the lines on the circuit substrate during the manufacturing process of a micro-sensor, the present invention is directed to a micro-sensor, which is adapted to eliminating the difficulty in the process of concentrating all devices on a single circuit board and simplifying the step of connecting a plurality of transmission lines to one end of metal wires exposed out of a plurality of wiring groove structures.

The present invention provides a micro-sensor for a micro image pick-up device. The micro-sensor includes a first circuit substrate, a second circuit substrate, a plurality of first signal transmission lines, and a plurality of second signal transmission lines. The first circuit substrate has a first surface and a second surface opposite to the first surface. There are a plurality of main printed wires that is divided into a first wire group and a second wire group at the other end formed on the first surface. There is an image sensing device that is disposed on the first surface to electrically connect to the plurality of main printed wires. The second surface has a main connector electrically connected to the second wire group. The second circuit substrate has a plurality of sub printed wires with an equivalent number as and corresponding to the second wire group, and further has a sub-connector disposed thereon and electrically connected to the plurality of sub printed wires. The plurality of first signal transmission lines is electrically connected to the first wire group of the first circuit substrate. The plurality of second signal transmission lines is electrically connected to the plurality of sub printed wires of the second circuit substrate.

The micro-sensor of the present invention further includes a plurality of wiring grooves. There are a plurality of wiring grooves continuously arranged at an interval being disposed at outer edges of the first circuit substrate, and there are a plurality of wiring grooves continuously arranged at an interval being disposed at outer edges of the second circuit substrate. The wiring grooves of the first circuit substrate and the wiring grooves of the second circuit substrate are arranged in a staggered manner.

The present invention provides a manufacturing method of a micro-sensor, which includes the following steps: preparing a first circuit substrate, and forming a plurality of main printed wires on a first surface of the first circuit substrate; disposing an image sensing device on the first surface, and electrically connecting the image sensing device to the plurality of main printed wires; dividing the plurality of main printed wires into a first wire group and a second wire group at the other end thereof; disposing a main connector on a second surface of the first circuit substrate, and electrically connecting the main connector to the second wire group; preparing a second circuit substrate, and forming a plurality of sub printed wires with an equivalent number as and corresponding to the second wire group on the second circuit substrate; disposing a sub-connector on the second circuit substrate, and electrically connecting the sub-connector to the plurality of sub printed wires; electrically connecting a plurality of first signal transmission lines to the first wire group of the first circuit substrate; and electrically connecting a plurality of second signal transmission lines to the plurality of sub printed wires of the second circuit substrate.

In the micro-sensor of the present invention, through connecting the main connector disposed on the first circuit substrate to the sub-connector disposed on the second circuit substrate, the image sensing device, passive devices originally distributed on a single circuit board and printed wires formed on a single circuit board are separately disposed on the first circuit substrate and the second circuit substrate. Furthermore, through electrically connecting the main connector to the sub-connector, it can avoid concentrating all the devices on a single circuit board, so as to overcome the difficulties in the manufacturing process, and thus reducing the cost.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

Figure 1:
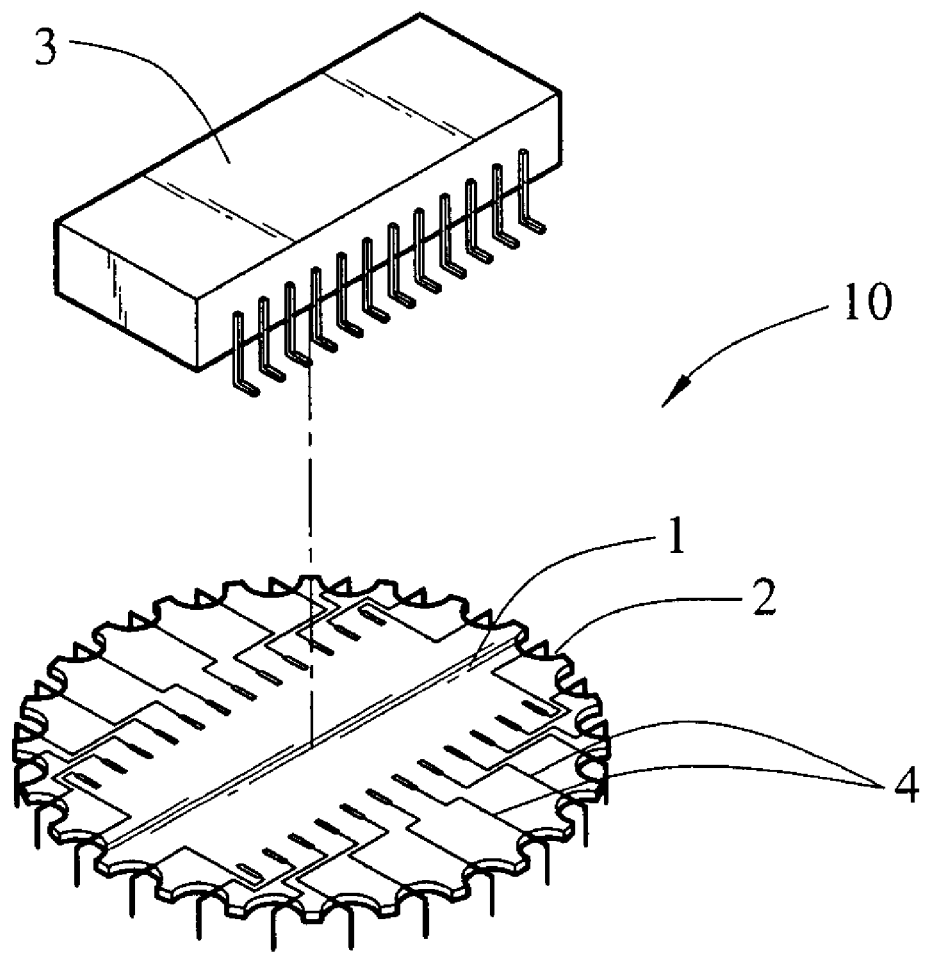
FIG. 1 is a schematic view of a conventional micro-sensor.
Figure 2:
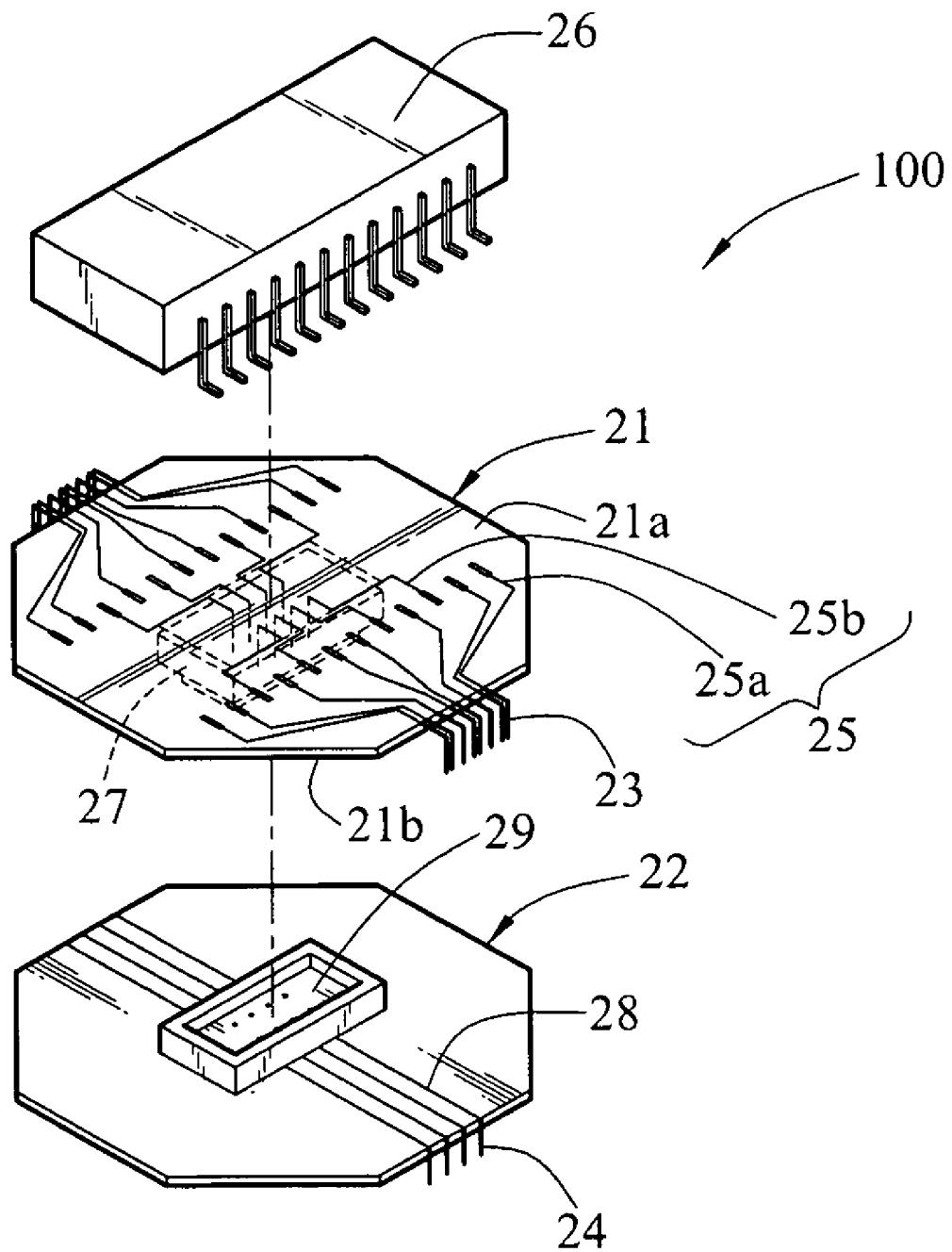
FIG. 2 is a schematic view of a first embodiment of the present invention.

Referring to FIG. 2, it is a schematic view of a first embodiment of the present invention. A micro-sensor 100 of the present invention is applied to a micro image pick-up device. The micro-sensor 100 includes a first circuit substrate 21, a second circuit substrate 22, a plurality of first signal transmission lines 23, and a plurality of second signal transmission lines 24. The first circuit substrate 21 has a first surface 21a and a second surface 21b opposite to the first surface 21a. There are a plurality of main printed wires 25 that is divided into a first wire group 25a and a second wire group 25b at the other end formed on the first surface 21a. There is an image sensing device 26 that is disposed on the first surface 21a to electrically connect to the plurality of main printed wires 25. The second surface 21b has a main connector 27 disposed thereon and electrically connected to the second wire group 25b. The second circuit substrate 22 has a plurality of sub printed wires 28 with an equivalent number as corresponding to the second wire group 25b, and the second circuit substrate has a sub-connector 29 disposed thereon and electrically connected to the plurality of sub printed wires 28. The plurality of first signal transmission lines 23 is electrically connected to the first wire group 25a of the first circuit substrate 21. The plurality of second signal transmission lines 24 is electrically connected to the plurality of sub printed wires 28 of the second circuit substrate 22. As illustrated in FIG. 2, the wires in the first wire group 25a extend towards the outer edges of the first circuit substrate 21, and the wires in the second wire group 25b extend towards the main connector 27.

The first circuit substrate 21 and the second circuit substrate 22 are printed circuit boards. Definitely, other substrates may also be used. The first circuit substrate 21 and the second circuit substrate 22 may be rigid substrates or flexible substrates. The rigid substrates are made of glass fiber, bakelite, or other materials; and the flexible substrates are made of polyimide (PI), polyethylene terephthalate (PET), or other materials. The plurality of first signal transmission lines 23 and the plurality of second signal transmission lines 24 may be micro-coaxial wires, Teflon insulated wires, or other signal transmission lines.

In the micro-sensor of the present invention, through connecting the main connector 27 disposed on the first circuit substrate 21 to the sub-connector 29 disposed on the second circuit substrate 22, the image sensing device 26, passive devices originally distributed on a single circuit board and printed wires formed on a single circuit board are separately disposed on the first circuit substrate 21 and the second circuit substrate 22. Furthermore, through electrically connecting the main connector 27 to the sub-connector 29, it can avoid concentrating all the devices on a single circuit board, so as to overcome the difficulties in the manufacturing process, and thus reducing the cost.

Figure 3:
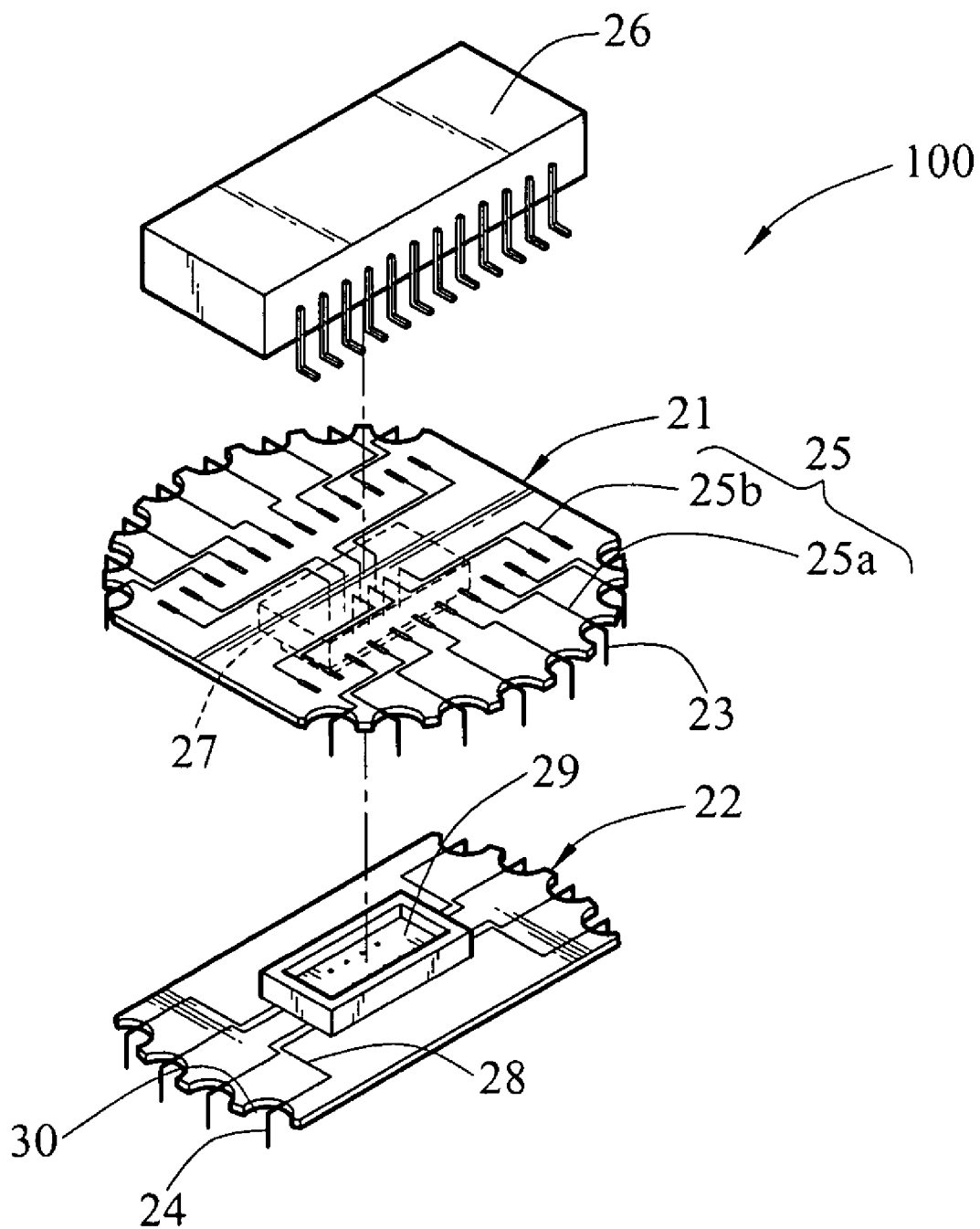
FIG. 3 is a schematic view of a second embodiment of the present invention.

Referring to FIG. 3, it is a schematic view of a second embodiment of the present invention. The structure of a micro-sensor 100 in this embodiment has already been disclosed in the first embodiment, so the same between the first embodiment and the second embodiment will not be repeated herein. This embodiment is characterized in that there are a plurality of wiring grooves 30 continuously arranged at an interval being disposed at outer edges of the first circuit substrate 21 and there are a plurality of wiring grooves 30 continuously arranged at an interval being disposed at outer edges of the second circuit substrate 22. The first wire group 25a on the first circuit substrate 21 are connected to the plurality of first signal transmission lines 23 through the plurality of wiring grooves 30 continuously arranged at an interval. The plurality of sub printed wires 28 on the second circuit substrate 22 are connected to the plurality of second signal transmission lines 24 through the plurality of wiring grooves 30 continuously arranged at an interval. Through the design of the wiring grooves 30, the plurality of first signal transmission lines 23 in the plurality of wiring grooves 30 continuously arranged at an interval may be easily connected to the first wire group 25a, and the plurality of second signal transmission lines 24 in the plurality of wiring grooves 30 continuously arranged at an interval may be easily connected to the plurality of sub printed wires 28 through welding. The plurality of wiring grooves 30 continuously arranged at an interval may have a geometric shape, such as semicircle or semiellipse.

The plurality of wiring grooves 30 continuously arranged at an interval of the first circuit substrate 21 and the wiring grooves 30 of the second circuit substrate 22 are arranged in a staggered manner, such that the plurality of first signal transmission lines 23 may be easily connected to the first circuit substrate 21, after the first circuit substrate 21 and the second circuit substrate 22 are connected through the main connector 27 and the sub-connector 29, so the plurality of first signal transmission lines 23 connecting to the first circuit substrate 21 does not make the manufacturing process become difficult due to the second circuit substrate 22.

Figure 4:
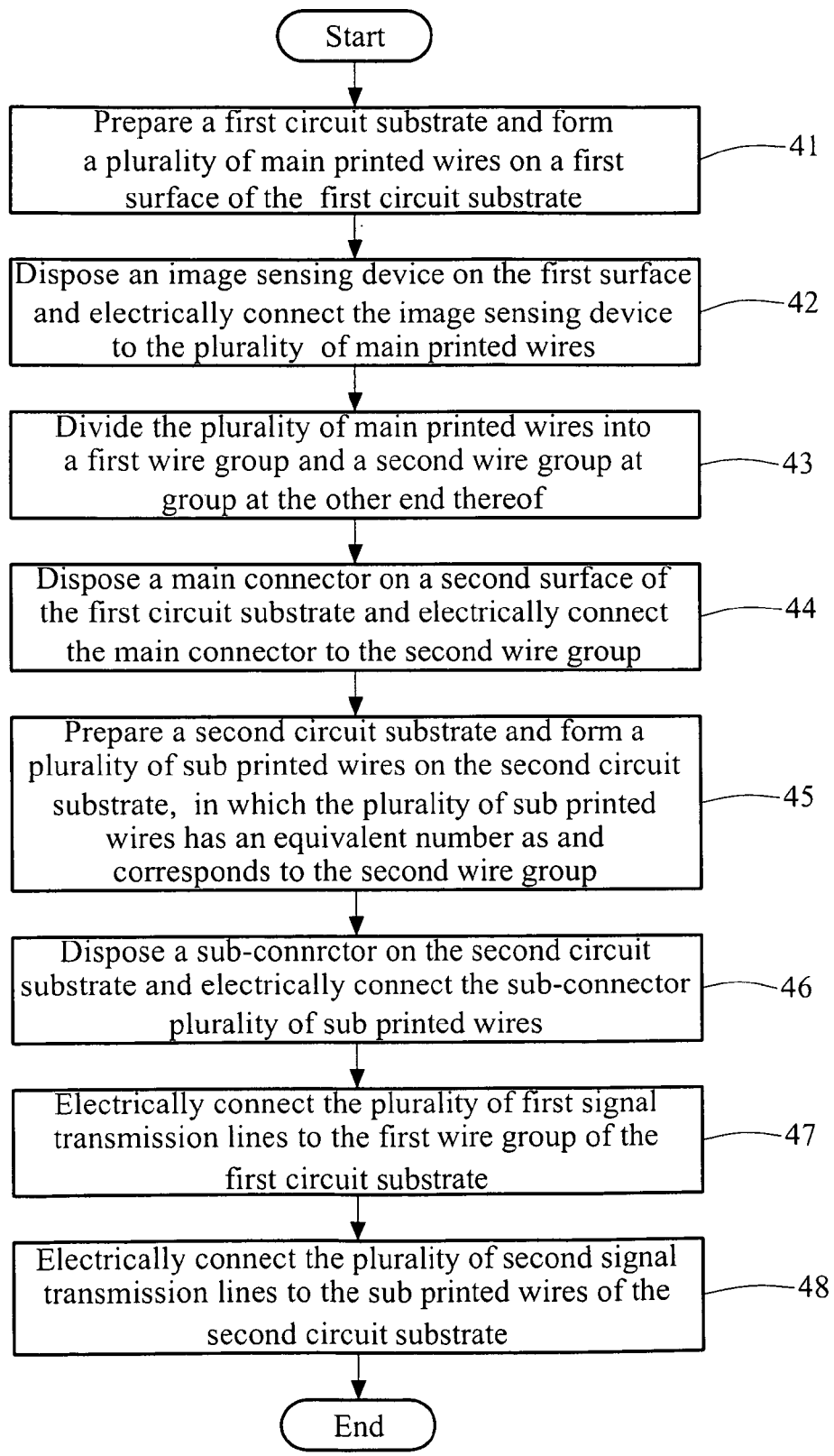
FIG. 4 is a flow chart of a manufacturing method of the micro-sensor according to the present invention.

Referring to FIG. 4, it is a flow chart of a manufacturing method of the micro-sensor according to the present invention. The manufacturing method of the micro-sensor according to the present invention includes the following steps. Firstly, a first circuit substrate is prepared, and a plurality of main printed wires is formed on a first surface of the first circuit substrate (Step 41). Next, an imaging sensing device is disposed on the first surface, and electrically connected to the plurality of main printed wires (Step 42). Then, the plurality of main printed wires is divided into a first wire group and a second wire group at the other end thereof (Step 43). Then, a main connector is disposed on a second surface of the first circuit substrate, and electrically connected to the second wire group (Step 44). Then, a second circuit substrate is prepared, and a plurality of sub printed wires with an equivalent number as and corresponding to the second wire group is formed on the second circuit substrate (Step 45). Then, a sub-connector is disposed on the second circuit substrate, and electrically connected to the plurality of sub printed wires (Step 46). Then, a plurality of first signal transmission lines is electrically connected to the first wire group of the first circuit substrate (Step 47). Finally, a plurality of second signal transmission lines is electrically connected to the plurality of sub printed wires of the second circuit substrate (Step 48).

What is claimed is:

1. A micro-sensor for a micro image pick-up device, the micro-sensor comprising:
    a first circuit substrate, having a first surface and a second surface opposite to the first surface;
    a plurality of main printed wires, divided into a first wire group and a second wire group, formed on the first surface of the first circuit substrate;
    an image sensing device disposed on the first surface of the first circuit substrate, and being electrically connected to the plurality of main printed wires;
    a main connector formed on the second surface of the first circuit substrate, and being electrically connected to the second wire group;
    a second circuit substrate, having a plurality of sub printed wires, each corresponding to one wire in the second wire group, and having a sub-connector electrically connected to the plurality of sub printed wires and to the main connector;
    a plurality of first signal transmission lines, each electrically connected to one wire in the first wire group; and
    a plurality of second signal transmission lines, each electrically connected to one of the plurality of sub printed wires.

2. The micro-sensor as claimed in claim 1, wherein there are a plurality of wiring grooves continuously arranged at an interval being disposed at outer edges of the first circuit substrate and there are a plurality of wiring grooves continuously arranged at an interval being disposed at outer edges of the second circuit substrate.

3. The micro-sensor as claimed in claim 2, wherein the wiring grooves of the first circuit substrate and the wiring grooves of the second circuit substrate are arranged in a staggered manner.

4. The micro-sensor as claimed in claim 1, wherein the plurality of first signal transmission lines are micro-coaxial wires or Teflon insulated wires.

5. The micro-sensor as claimed in claim 1, wherein the plurality of second signal transmission lines are micro-coaxial wires or Teflon insulated wires.

6. The micro-sensor of claim 1, wherein the number of sub printed wires equals to the number of wires in the second wire group.

7. The micro-sensor of claim 1, wherein wires in the first wire group extend towards outer edges of the first circuit substrate, and wires in the second wire group extend towards the main connector.

8. A manufacturing method of a micro-sensor, comprising:
    preparing a first circuit substrate, and forming a plurality of main printed wires, including a first wire group and a second wire group, on a first surface of the first circuit substrate;
    disposing an image sensing device on the first surface, and electrically connecting the image sensing device to the plurality of main printed wires;
    disposing a main connector on a second surface of the first circuit substrate, and electrically connecting the main connector to the second wire group;
    preparing a second circuit substrate, and forming a plurality of sub printed wires on the second circuit substrate, wherein each of sub printed wires corresponds to one wire in the second wire group;
    disposing a sub-connector on the second circuit substrate, and electrically connecting the sub-connector to the plurality of sub printed wires, and to the main connector;
    electrically connecting a plurality of first signal transmission lines to the first wire group of the first circuit substrate; and
    electrically connecting a plurality of second signal transmission lines to the sub printed wires of the second circuit substrate.

9. The micro-sensor of claim 8, wherein the number of sub printed wires equals to the number of wires in the second wire group.

10. The micro-sensor of claim 8, wherein wires in the first wire group extend towards outer edges of the first circuit substrate, and wires in the second wire group extend towards the main connector.

* * * * *